United States Patent
Mangtani et al.

(10) Patent No.: US 12,543,574 B2
(45) Date of Patent: Feb. 3, 2026

(54) VOLTAGE-ISOLATED INTEGRATED CIRCUIT PACKAGES

(71) Applicant: Allegro MicroSystems, LLC, Manchester, NH (US)

(72) Inventors: Vijay Mangtani, Nashua, NH (US); William P. Taylor, Amherst, NH (US); Paul A. David, Bow, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 395 days.

(21) Appl. No.: 18/300,708

(22) Filed: Apr. 14, 2023

(65) Prior Publication Data

US 2024/0347472 A1     Oct. 17, 2024

(51) Int. Cl.

| | |
|---|---|
| *H01L 23/552* | (2006.01) |
| *H01F 27/28* | (2006.01) |
| *H01L 23/00* | (2006.01) |
| *H01L 23/31* | (2006.01) |
| *H01L 23/495* | (2006.01) |
| *H01L 25/065* | (2023.01) |

(52) U.S. Cl.
CPC ....... *H01L 23/552* (2013.01); *H01F 27/2804* (2013.01); *H01L 23/3107* (2013.01); *H01L 23/49575* (2013.01); *H01L 24/48* (2013.01); *H01L 25/0655* (2013.01); *H01L 2224/48245* (2013.01)

(58) Field of Classification Search
None
See application file for complete search history.

(56) References Cited

U.S. PATENT DOCUMENTS

| 4,461,966 A | 7/1984 | Hebenstreit |
|---|---|---|
| 4,748,351 A | 5/1988 | Barzegar |
| 4,970,420 A | 11/1990 | Billings |

(Continued)

FOREIGN PATENT DOCUMENTS

| DE | 3700488 A1 | 7/1988 |
|---|---|---|
| DE | 10 2004 033 125 A1 | 2/2006 |

(Continued)

OTHER PUBLICATIONS

Bourgeois, "An Isolated Gate 25 Drive For Power MOSFETs and IGBTs", STMicroelectronics Group, AN461/0194, 1999; 7 pages.

(Continued)

*Primary Examiner* — Jack S Chen
(74) *Attorney, Agent, or Firm* — DALY, CROWLEY, MOFFORD & DURKEE, LLP

(57) ABSTRACT

Aspects of the present disclosure include systems, structures, circuits, and methods providing voltage-isolated integrated circuit (IC) packages or modules having a transformer integrated with or implemented on a lead frame. A portion of transformer windings may include a conductive portion of a lead frame. Conductive structure, such as wire bonds, may be used for other portions of transformer windings. In some examples, an insulating coating may be placed on the package to increase the isolation capability of the final package. The IC packages and modules may include various types of circuits; in some examples, IC packages or modules may include a galvanically isolated gate driver or other high voltage circuit.

16 Claims, 13 Drawing Sheets

(56) References Cited

U.S. PATENT DOCUMENTS

| | | |
|---|---|---|
| 5,019,719 A | 5/1991 | King |
| 5,051,609 A | 9/1991 | Smith |
| 5,430,613 A | 7/1995 | Hastings et al. |
| 5,598,135 A | 1/1997 | Maeda et al. |
| 5,847,631 A | 12/1998 | Taylor et al. |
| 5,959,846 A | 9/1999 | Noguchi et al. |
| 6,107,860 A | 8/2000 | Vinciarelli |
| 6,181,130 B1 | 1/2001 | Hoshi et al. |
| 6,281,560 B1 | 8/2001 | Allen et al. |
| 6,377,155 B1 | 4/2002 | Allen et al. |
| 6,775,901 B1 | 8/2004 | Lee et al. |
| 6,791,851 B2 | 9/2004 | Brkovic |
| 7,023,315 B2 | 4/2006 | Yeo et al. |
| 7,119,448 B1 | 10/2006 | de Stasi |
| 7,173,835 B1 | 2/2007 | Yang |
| 7,663,351 B2 | 2/2010 | Korsunsky |
| 7,719,112 B2 | 5/2010 | Shen |
| 7,804,697 B2 | 9/2010 | Melanson |
| 7,868,431 B2 | 1/2011 | Feng et al. |
| 8,063,689 B2 | 11/2011 | Theiler |
| 8,094,458 B2 | 1/2012 | Furnival |
| 8,217,748 B2 | 7/2012 | Feng et al. |
| 8,680,837 B2 | 3/2014 | Zeng et al. |
| 8,736,343 B2 | 5/2014 | Chen et al. |
| 8,816,666 B2 | 8/2014 | Kimura et al. |
| 9,048,020 B2 | 6/2015 | Calvillo Cortes et al. |
| 9,660,584 B2 | 5/2017 | Modi et al. |
| 9,743,523 B2 | 8/2017 | Huang et al. |
| 9,847,166 B2 | 12/2017 | Kneller |
| 9,887,034 B2 | 2/2018 | Francis |
| 9,899,140 B2 | 2/2018 | Kneller et al. |
| 9,922,764 B2 | 3/2018 | Kneller et al. |
| 9,948,294 B2 | 4/2018 | Peter et al. |
| 10,002,703 B2 | 6/2018 | Wang et al. |
| 10,014,798 B1 | 7/2018 | Vinciarelli |
| 10,062,495 B2 | 8/2018 | Lloyd |
| 10,176,917 B2 | 1/2019 | Parish et al. |
| 10,217,558 B2 | 2/2019 | Kneller |
| 10,224,143 B2 | 3/2019 | Kneller et al. |
| 10,229,779 B2 | 3/2019 | Harber |
| 10,234,513 B2 | 3/2019 | Vig et al. |
| 10,256,027 B2 | 4/2019 | Li et al. |
| 10,319,509 B2 | 6/2019 | Kneller et al. |
| 10,347,413 B2 | 7/2019 | Francis |
| 10,573,457 B2 | 2/2020 | Wang et al. |
| 10,811,181 B2 | 10/2020 | Parish et al. |
| 10,930,422 B2 | 2/2021 | Francis |
| 11,139,102 B2 | 10/2021 | Kneller et al. |
| 11,201,619 B2 | 12/2021 | Rinne et al. |
| 11,211,929 B2 | 12/2021 | Rinne et al. |
| 11,282,631 B2 | 3/2022 | Francis |
| 2009/0147544 A1 | 6/2009 | Melanson |
| 2009/0237899 A1 | 9/2009 | Furnival |
| 2010/0259909 A1 | 10/2010 | Ho et al. |
| 2012/0008344 A1 | 1/2012 | Zeng et al. |
| 2012/0206171 A1 | 8/2012 | Kimura et al. |
| 2013/0293268 A1 | 11/2013 | Draxelmayr et al. |
| 2016/0181004 A1 | 6/2016 | Li et al. |
| 2021/0376822 A1 | 12/2021 | Thompson et al. |
| 2022/0116036 A1 | 4/2022 | Rinne et al. |
| 2024/0347473 A1* | 10/2024 | Taylor .................. H01L 23/552 |
| 2024/0395736 A1* | 11/2024 | Horan ............... H02M 3/33523 |

FOREIGN PATENT DOCUMENTS

| | | |
|---|---|---|
| GB | 2 250 383 A | 6/1992 |
| GB | 2 341 288 A | 3/2000 |
| JP | H01300617 A | 12/1989 |
| JP | 2001 167941 A | 6/2001 |
| JP | 2003 234234 A | 8/2003 |
| JP | 2008 072021 A | 3/2008 |
| WO | WO 93/21690 33 | 10/1993 |
| WO | WO 95/12247 14 | 5/1995 |
| WO | WO 2009/008739 A1 | 1/2009 |
| WO | WO 2010/061281 A2 | 6/2010 |
| WO | WO 2011/137845 A1 | 11/2011 |
| WO | WO 2021/211920 A1 | 10/2021 |

OTHER PUBLICATIONS

"ADuM4135 Data Sheet, Single-/Dual-Supply, High Voltage Isolated IGBT Gate Driver with Miller Clamp", Analog Devices Inc., Rev. E, 2015; 17 pages.

"Si827x", Datasheet Rev. 0.5, Silicon Laboratories Inc., 2016; 43 pages.

International Search Report and Written Opinion dated Jul. 15, 2024, for International Application No. PCT/US2024/016656; 13 pages.

* cited by examiner

VOLTAGE-ISOLATED INTEGRATED CIRCUIT PACKAGES

BACKGROUND

Voltage isolation can be used for electronic packages having circuit components with two or more separate voltage levels connected to the electrical connections of the package. So-called "galvanic" isolation describes electrical isolation resulting from lack of a conductive (low resistance) path between given circuit components. Galvanic isolation can be used to prevent undesirable currents flowing from one side of an isolation barrier to the other. Such galvanic isolation can be used to separate circuits in order to protect users from coming into direct contact with hazardous voltages.

For solid state switches utilizing galvanic isolation, the control circuit with switch driver inputs typically reside on one side of the galvanic isolation barrier, while the switch driven by the switch driver typically resides on the other side of the isolation barrier. Various transmission techniques are available for signals to be sent across galvanic isolation barriers including optical, capacitive, and magnetic coupling techniques. Magnetic coupling typically relies on the use of a transformer (two magnetically coupled coils) to couple, yet galvanically separate, circuits on the different sides of the transformer, typically referred to as the primary and secondary sides.

SUMMARY

An aspect of the present disclosure is directed to and includes a voltage-isolated integrated circuit package with lead frame and transformer. The lead frame can include first and second conductive portions each configured to receive an integrated circuit die (which may also be referred to a semiconductor die); a first integrated circuit die may be disposed on the lead frame on, e.g., a first conductive portion; a second integrated circuit die (which may also be referred to a semiconductor die) may be disposed on the lead frame on a second, e.g., conductive portion. The package can include: a transformer having first and second coils, configured to provide magnetic coupling and galvanic separation between the first and second integrated circuit dies; a dielectric material can enclose a portion of the transformer; a mold material configured to cover a portion of the lead frame; and a housing or cap configured to cover the transformer, the mold material, and the dielectric material. In some example/embodiments, the mold material can be composed of or include the dielectric material; in other words, the mold material and dielectric material can be the same material.

Implementations may include one or more of the following features. The lead frame of the voltage-isolated integrated circuit package may include a partially-etched portion, and the cap can be positioned over the partially-etched portion of the lead frame. The mold material may include a first mold material secured to the lead frame; and a second mold material enclosing the first integrated circuit die and the second integrated circuit die. The lead frame may include a plurality of voltage leads extending from a side of the package. The transformer may include first and second coils, each having one or more windings, a support platform or substrate, e.g., dielectric structure, as well as a ferromagnetic (e.g., ferrite) core One or more conductive structures, e.g., plating and/or vias, can be used for lower winding portions, and one or more conductive structures, e.g., wire bonds, can be used for upper winding portions.

The upper and lower winding portions, together, can form one or more windings of the first and second coils of the transformer. The dielectric structure may include one or more of a flexible circuit, a printed circuit board (PCB), a low temperature cofired ceramic (LTCC), an alumina substrate having thin film layers, a glass substrate having thin film layers, metal on silicon, and/or a high temperature ceramic (HTCC). The cap may include plastic. The dielectric material may include a soft gel.

A shortest distance between the first and second conductive portions of the lead frame may be at least 1 mm. A shortest distance between the first and second conductive portions of the lead frame may be at least 1.2 mm. A shortest distance between the first and second conductive portions of the lead frame may be at least 1.5 mm. A shortest distance between the first and second conductive portions of the lead frame may be at least 3 mm. A shortest distance between the first and second conductive portions of the lead frame may be at least 5.5 mm. A shortest distance between the first and second conductive portions of the lead frame may be at least 7.2 mm. A shortest distance between the first and second conductive portions of the lead frame may be at least 8 mm. The first or second integrated circuit dies may include a gate driver configured to drive a solid state switch.

Another aspect of the present disclosure is directed to and includes a voltage-isolated integrated circuit package. The voltage-isolated integrated circuit package can include: a conductive lead frame; first and second conductive portions, such as die attach paddles (a.k.a., die paddles) of or disposed on the conductive lead frame, and the first and second die paddles may include con-conductive material; a first integrated circuit die (which may also be referred to as a semiconductor die) disposed on (or connected to, directly or indirectly) the first conductive portion (e.g., die paddle); a second integrated circuit die disposed on (or connected to, directly or indirectly) the second conducive portion (e.g., die paddle); a transformer configured to provide magnetic coupling and galvanic separation between the first and second integrated circuit dies (and any respective IC(s) includes on those dies); a dielectric material disposed between first and second coils of the transformer; and a mold material forming a package body configured to enclose the transformer, the dielectric material, the first integrated circuit die, and the second integrated circuit die. In some example/embodiments, the mold material can be composed of or include the dielectric material; in other words, the mold material and dielectric material can be the same material.

Implementations may include one or more of the following features. The lead frame of the voltage-isolated integrated circuit package may include a partially-etched portion and the voltage-isolated integrated circuit package may further include a cap positioned over the partially-etched portion of the lead frame and the transformer. The lead frame may include a plurality of voltage leads, and the plurality of voltage leads may include portions extending from the package body. In some embodiments, the transformer may include a support platform or substrate, e.g., dielectric structure, as well as a ferromagnetic (e.g., ferrite) core, one or more conductive structures, e.g., plating and/or vias, used for lower winding portions, and one or more conductive structures, e.g., wire bonds, used for upper winding portions.

The upper and lower winding portions, together, can form one or more windings of the first and second coils of the transformer. The voltage-isolated integrated circuit package may include a first plurality of wire bonds connecting the lead frame to the first integrated circuit die. The voltage-isolated integrated circuit package may include a second plurality of wire bonds connecting the lead frame to the second integrated circuit die. A shortest distance between the first and second plurality of wire bonds may be at least 1 mm. A shortest distance between the first and second plurality of wire bonds may be at least 1.2 mm. A shortest distance between the first and second plurality of wire bonds may be at least between about 1.4 mm and about 1.5 mm (inclusive of those dimensions). A shortest distance between the first and second plurality of wire bonds may be at least 3 mm. A shortest distance between the first and second plurality of wire bonds may be at least 5.5 mm. A shortest distance between the first and second plurality of wire bonds may be at least 7.2 mm. A shortest distance between the first and second plurality of wire bonds may be at least 8 mm. The first or second integrated circuit die may include a gate driver.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF DRAWINGS

The manner and process of making and using the disclosed examples and embodiments may be appreciated by reference to the figures of the accompanying drawings. In the figures like reference characters refer to like components, parts, elements, or steps/actions; however, similar components, parts, elements, and steps/actions may be referenced by different reference characters in different figures.

It should be appreciated that the components and structures illustrated in the figures are not necessarily to scale, emphasis instead being placed upon illustrating the principals of the concepts described herein. Furthermore, embodiments are illustrated by way of example and not limitation in the figures, in which:

FIG. 2A shows a top-view of lead frame structure and lower winding portion with sacrificial winding retainers used for the fabrication process;

FIG. 2B shows a side-view of the lead frame structure and lower winding portions of FIG. 2A, taken along cutting line A-A' line;

FIG. 2C shows a side-view of the lead frame structure and lower winding portions of FIG. 2A, taken along cutting line B-B';

FIG. 2D shows a side view of the lead frame structure and lower winding portions of FIG. 2B after removal of the sacrificial winding retainer material;

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Aspects of the present disclosure are directed to and include systems, structures, circuits, and methods providing voltage-isolated integrated circuit (IC) packages having transformers implemented with molded lead frames.

Figure 1A:
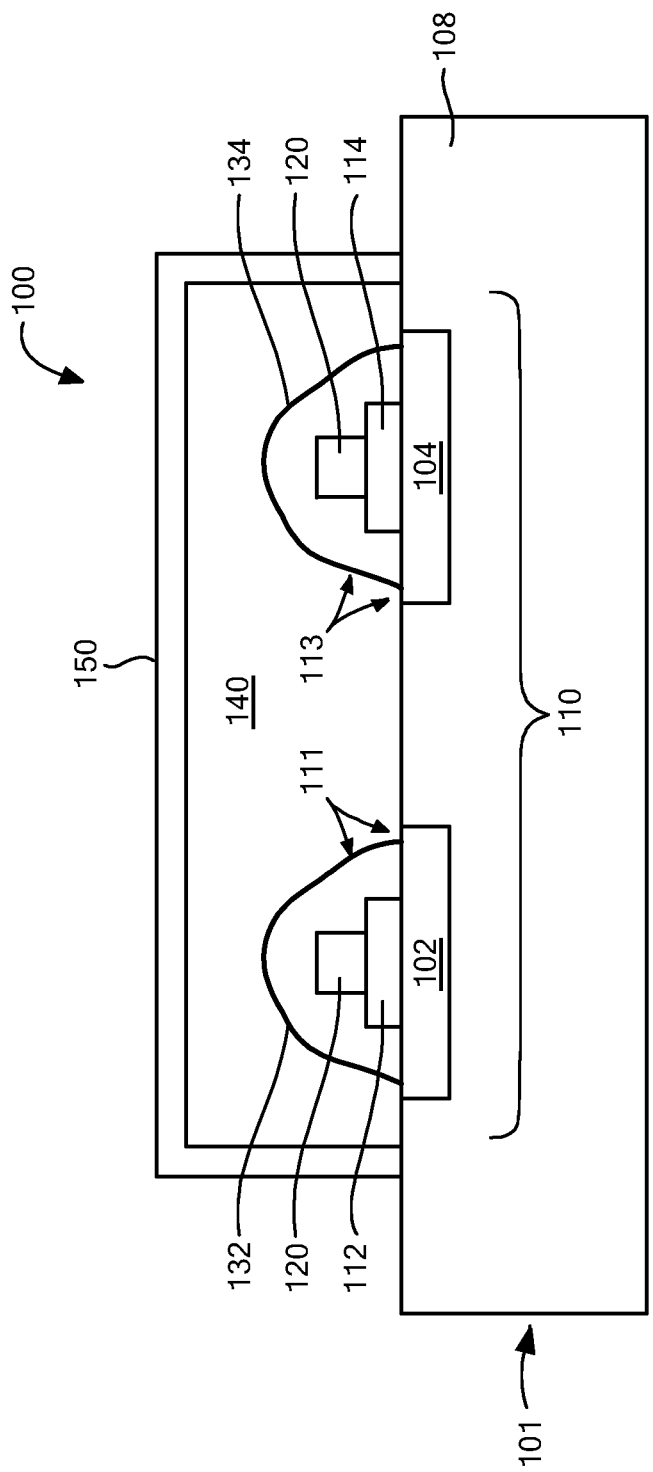
FIG. 1A shows a side-view of an example voltage-isolated transformer package with a molded lead frame and transformer, in accordance with the present disclosure.

FIG. 1A shows a side-view of an example voltage-isolated transformer package 100 with a molded lead frame and transformer, in accordance with the present disclosure. High voltage package 100 includes lead frame (or lead frame material) 101 including conductive material (e.g., copper or the like), which can be selectively molded with mold compound 108. Lead frame 101 can include exposed portions 102, 104 that can be used as portions of transformer 110, as described below.

Transformer 110 can include first and second windings 111, 113 having multiple components (pieces or portions). For example, first and second windings 111, 113 may include lower winding portions 102, 104, respectively, and upper winding portions 132, 134, respectively, as shown. The upper and lower winding portions, together, can form windings (coils) of transformer 110. Lower winding portions 102, 104 can be formed of or include exposed portions 102, 104 of lead frame 101. Upper winding portions 132, 134 can be composed of or include wire bonds, or other conductive structure, e.g., straps, thin strips, etc., in example embodiments. An insulating material 112, 114, including, but not limited to, a non-conductive epoxy, dielectric gel, or an insulating tape, may be present to provide/facilitate electrical isolation between transformer core 120 and lower winding portions 102, 104. As noted, for transformer 110 upper winding portions (e.g., wire bonds) 132, 134 can be connected to lower winding portions 102, 104 to form windings 111, 113 around transformer core 120. One or more semiconductor dies (not shown) having integrated circuits (ICs) may be present and connected to the windings 111, 113, e.g., for voltage (galvanic) isolation. In some embodiments, first and second windings 111, 113 can correspond to or include primary and secondary windings (coils) of transformer 110.

A dielectric material 140, e.g., a soft gel material, may be placed over the transformer 110 to provide electrical isolation between the upper windings (wire bonds) 132, 134 and the transformer core 120 as well as any insulating material, e.g., tape 112, 114. In some examples, the dielectric material 140 may be a material such as, but not limited to, DOWSIL™ EG-3810 Dielectric Gel and DOWSIL™ EG-3896 Dielectric Gel which has the ability to provide isolation greater than 20 kV/mm. Other gel materials may be used in addition or substitution, e.g., to meet the voltage isolation specifications (e.g., voltage breakdown requirements) required by a given package design or performance criteria. DOWSIL™ EG-3810 is designed for temperature ranges from −60° C. to 200° C. and DOWSIL™ EG-3896 Dielectric Gel −40° C. to +185° C. both of which meet or exceed typical or worst case automotive operational temperature ranges. An enclosure (e.g., cap) 150 may be placed over the mold compound 108 and transformer core 120 to protect the transformer 110, in some embodiments. In some embodiments, enclosure 150 may be formed as a mold, e.g., from a separate molding step, to create a molded body.

Figure 1B:
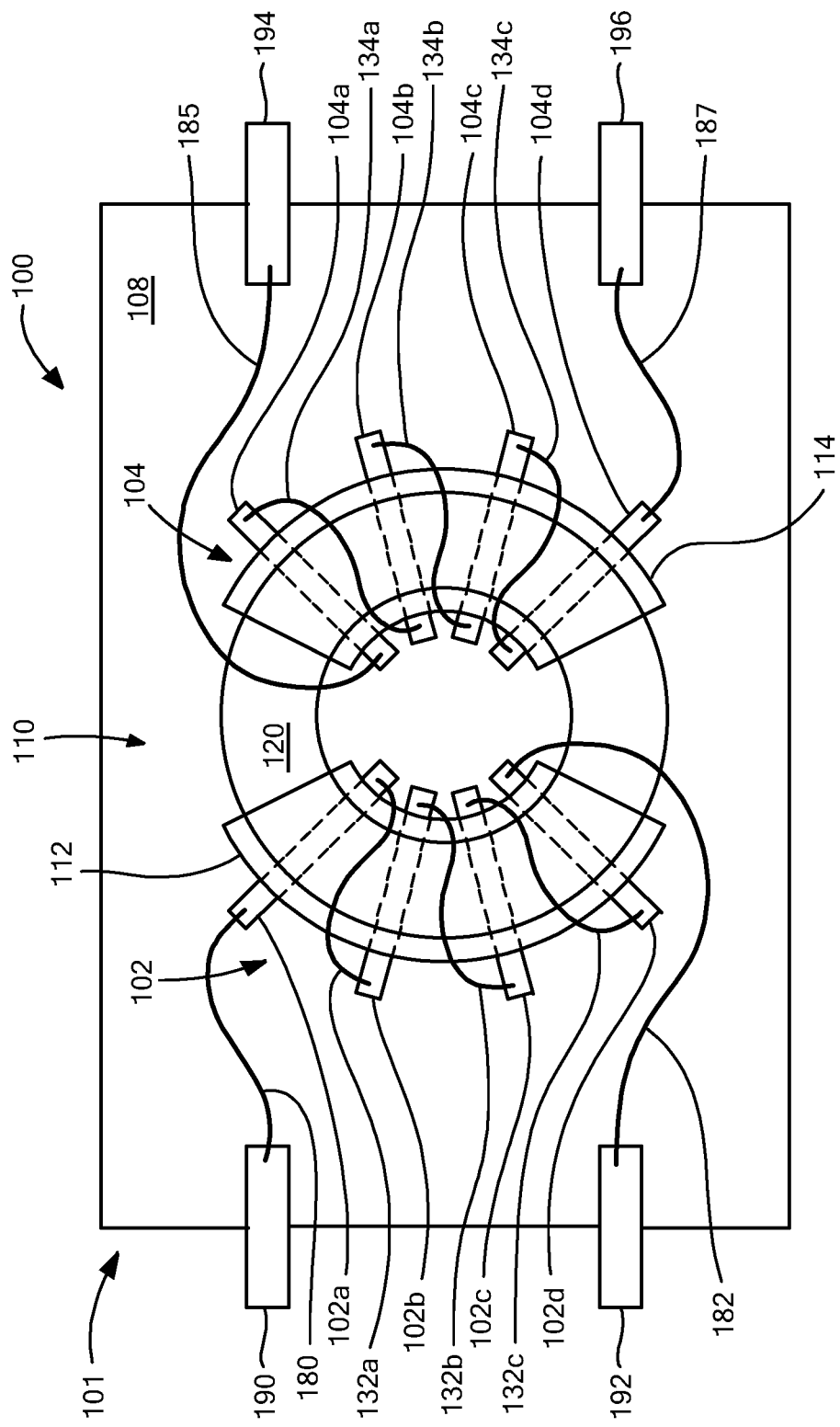
FIG. 1B shows a top-view of the voltage-isolated package of FIG. 1A.

FIG. 1B shows a top-view of the voltage-isolated package 100 of FIG. 1A. Leads 190, 192, 194, 196 and lower winding portions 102 (including 102a-d), and 104 (including 104a-d) are shown in the mold compound 108. Insulating tape layers 112, 114 are shown under transformer core 120. Lead 190 can be electrically connected via wire bond 180 to lower winding (coil) portion 102a, and the other side of lower winding portion 102a can be connected by wire bond 132a to lower winding portion 102b. Lower winding portions 102a-d and 104a-d can be connected by wire bonds (which form the upper winding portions) to other portions of the lower windings. For example, as shown, lower winding portion 102b can be connected by wire bond 132b to lower winding portion 102c, while lower winding portion 132c can be connected by wire bond 132c to lower winding portion 102d. Lower winding portion 102d can be connected by wire bond 182 to lead 192. Lead 194 can be electrically connected to lower portion 104a by wire bond 185. Lower winding portion 104a can be connected by wire bond 134a to lower winding portion 104b. Lower winding portion 104b can be connected by wire bond 134b to lower winding portion 134c. Lower winding portion 104c can be connected by wire bond 134c to lower winding portion 104d. Lower winding portion 104d can be connect by wire bond 187 to lead 196. In other examples and embodiments, insulating (tape) portions 112, 114 may be composed of or include a single insulator material as opposed to two (or more) pieces (parts, layers or components).

FIGS. 2A-2D illustrate an example lead frame and related structure, including sacrificial winding retainers, resulting from different stages of an example fabrication process 200 of a voltage-isolated package, in accordance with the present disclosure.

Figure 2A:
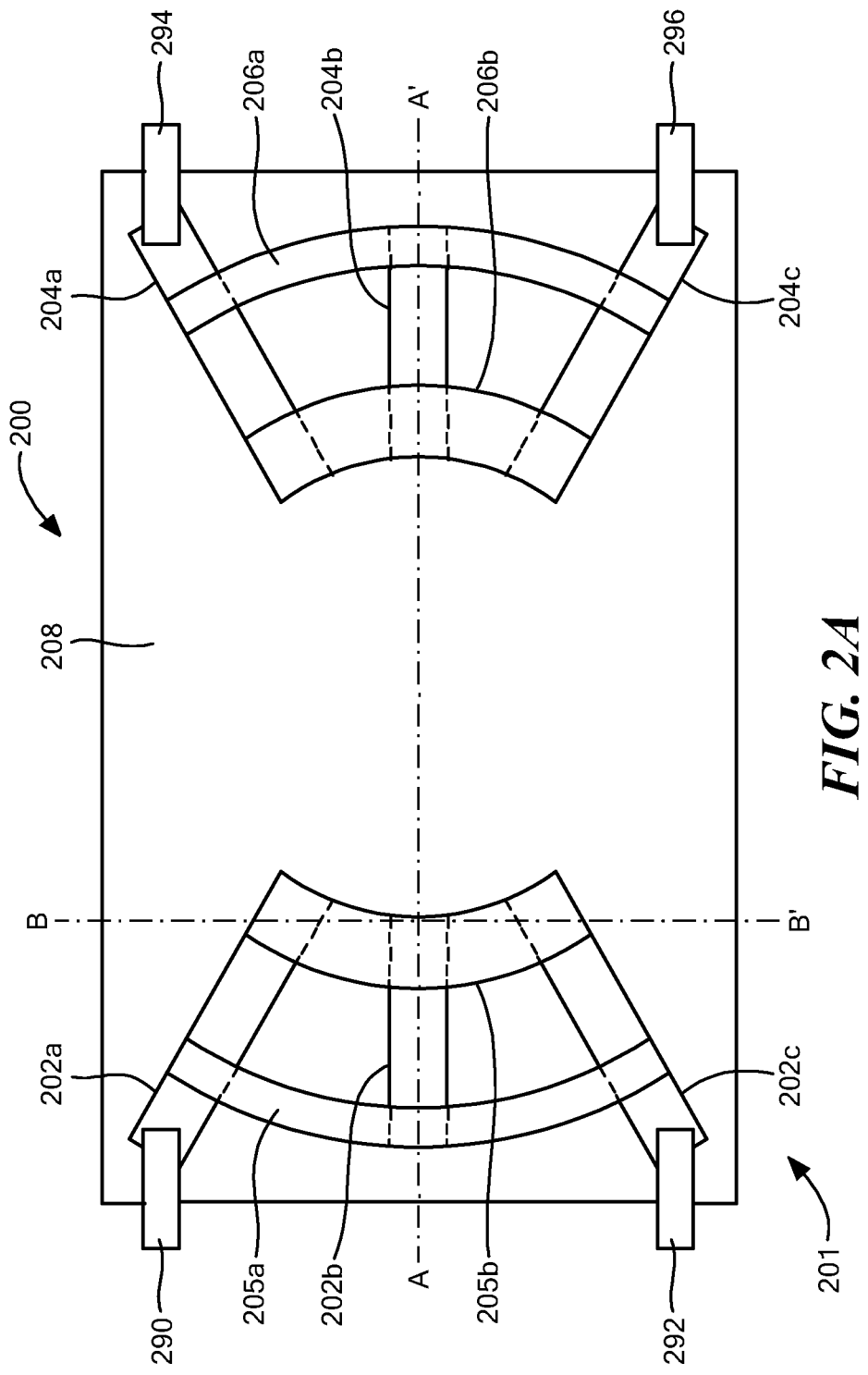
FIGS. 2A-2D illustrate an example lead frame and related structure, including sacrificial winding retainers, resulting from different stages of an example fabrication process of a voltage-isolated package, in accordance with the present disclosure.

FIG. 2A shows a top-view of a molded lead frame structure 201 with lower winding portions 202a-c, 204a-c along with sacrificial winding retainers 205a-b, 206a-b used for the fabrication process 200. During fabrication process 200. For the fabrication process 200, winding retainers 205a-b, 206a-b function to retain the lower winding portions 202a-c, 204a-c in place, e.g., during a prior molding step of process 200, and would/could be removed by a later step/stage of fabrication process 200.

FIG. 2A shows conductive lead frame material (e.g., copper) after being molded with mold compound 208.

Lower winding portions 202a-c, 204a-c are shown connected by temporary or sacrificial winding retainers 205a-b and 206a-b. Leads 290, 292, 294, 296 are shown connected to lower winding portions 202a, 202c, 204a, 204c, respectively. As explained in further detail below, winding retainers 205a-b, 206a-b can be removed at a later stage/step of process 200.

Winding retainers 205a-b, 206a-b can be formed from lead frame material and can be used as sacrificial structure to hold/secure/retain the lower windings (winding portions) in place during emplacement (e.g., one or more molding steps) of mold compound 208 adjacent the lower windings. Winding retainers 205a-b, 206a-b can be formed by one or more suitable techniques/processes, e.g., partial etching, grinding, polishing, etc. Winding retainers 205a-b, 206a-b can be removed by one or more suitable processes, e.g., polishing, etching, grinding, etc.

Figure 2B:
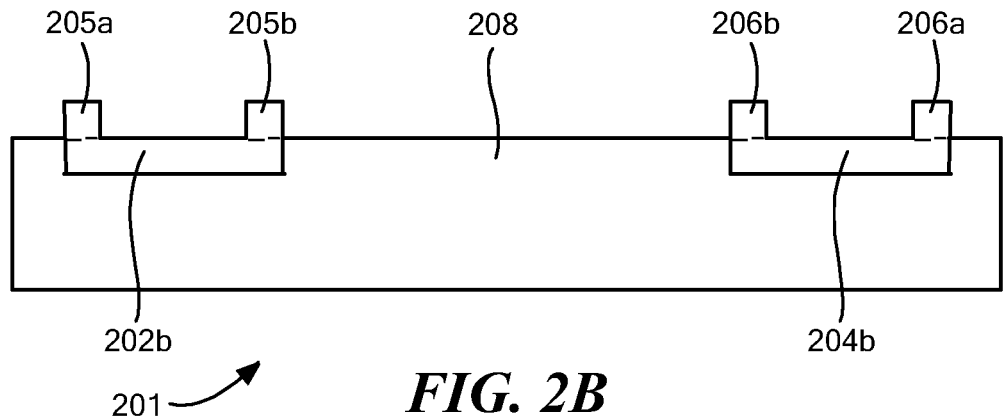

FIG. 2B shows the molded lead frame 201 and lower winding portions of FIG. 2A along the section line A-A'. Winding retainers 205a-b, 206a-b are shown connected to lower winding portions 202b, 204b. Mold material 208 is also shown (having been deposited previously). As shown, winding retainers 205a-b, 206a-b extend beyond (above) the top surface of the mold compound 208.

Figure 2C:
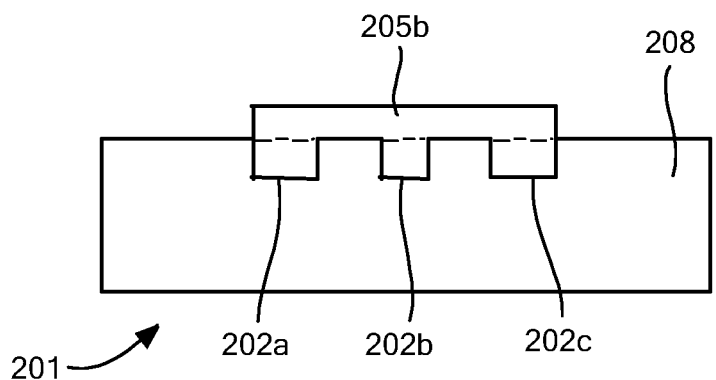

FIG. 2C shows the molded lead frame 201 and lower winding portions of FIG. 2A along the section line B-B'. Winding retainer 205b (and likewise winding retainers 205a, and 206a-b) can be formed by a partial etch, e.g., a half-etch or other similar process, and the lead frame material can be partially etched from one of two sides by a patterning different portion of the copper material to be etched or remain unetched; winding retainers 205a-b, 206a-b may alternatively or additionally be formed (at least, in part) by mechanical removal of lead frame material. As shown, formation of winding retainers, e.g., 205b, can result in regions where lead frame material is on multiple (e.g., two) levels and presenting different thickness. One level of lead frame material can be used to form lower windings 202a-c and another level of lead frame material can be used to provide winding retainer 205b, allowing mechanical connection and retention of lower winding portions 202a-c during molding (application) of mold material 208.

Figure 2D:
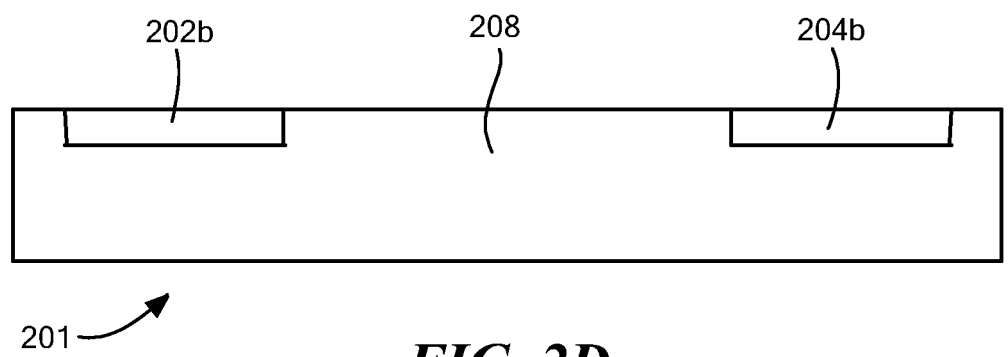

FIG. 2D shows a side view of the lead frame 201 and lower winding portion of FIG. 2B after removal of excess conductive material, including the (sacrificial) winding retainers 205a-b, 206a-b. Lower winding portions 202b, 204b are shown with mold compound 208 after winding retainers 205a-b, 206a-b have been removed by a suitable process such as chemical etching, mechanical removal (sanding, grinding, polishing, etc.) or a combination chemical-mechanical technique such as a chemical mechanical polishing (CMP). One or more etching and/or polishing steps may be used to achieve a desired flatness (e.g., degree of planarity) or surface finish of the lower winding portions. Fabrication process 200 can allow conductors/conductive components to spaced apart from other package features/components by a desired distance, e.g., lower winding portions 202b and 204b can fabricated to be separated/spaced apart by a desired distance. In some examples and embodiments, the distance between conductor portions 202b and 204b may be 1 mm, 1.2 mm. 1.4 mm, 1.5 mm, 2 mm, 4 mm, 6 mm, 7.2 mm, 10 mm, or more (10+mm), e.g., to meet a given voltage isolation requirement, including creepage and/or voltage breakdown requirements for a given pollution degree rating as defined by certain safety standards bodies such as the UL (Underwriters Laboratories), DIN (Deutsches Institut für Normung), ISO (International Organization for Standardization), VDA (Verband der Automobilindustrie) and/or the IEC (International Electrotechnical Commission), among others. Distance(s) between any conductor and the exterior environment of the package (e.g., represented by the bottom and/or side in the figure) can also be controlled/selected as desired by fabrication process 200.

Figure 3:
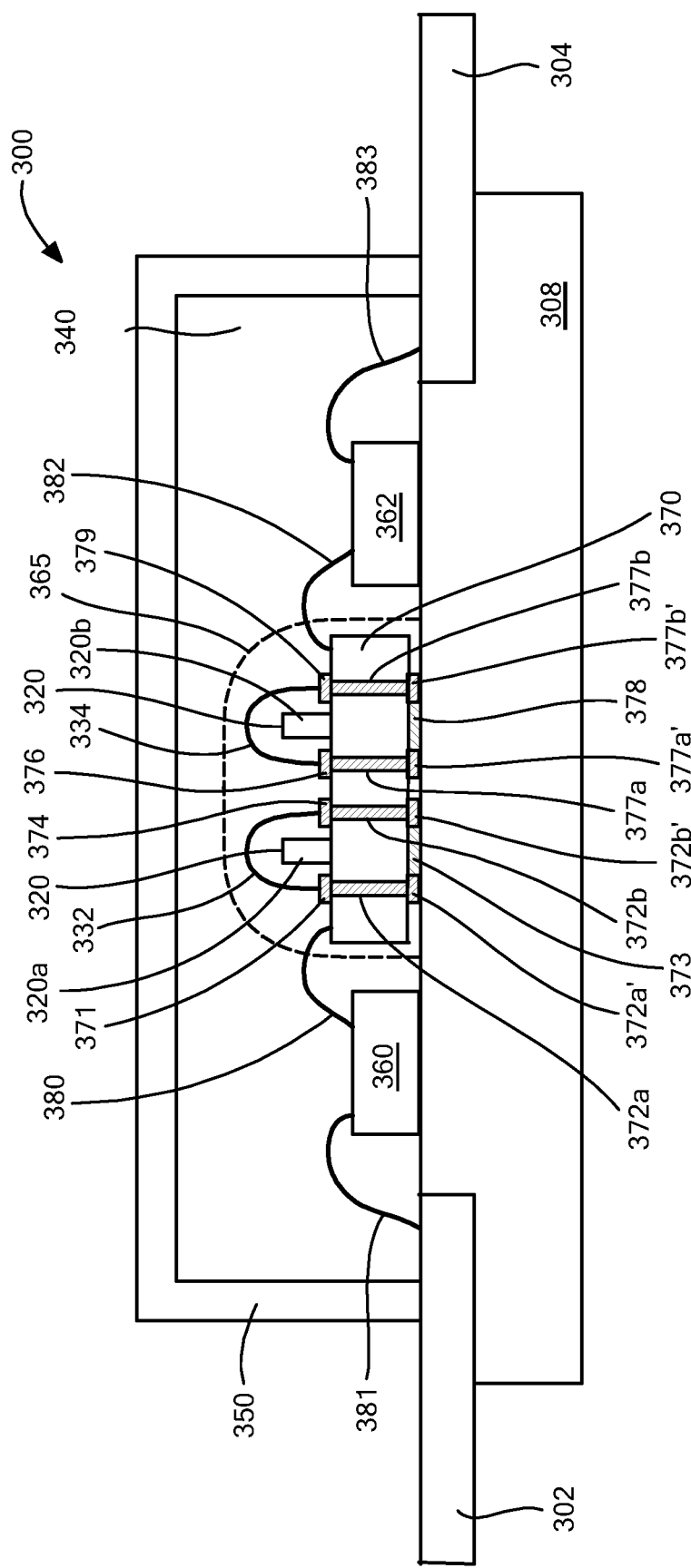
FIG. 3 shows a side view of an example high voltage-isolated package with a transformer supported by a substrate, in accordance with the present disclosure.

FIG. 3 shows a side view of a high voltage package 300 with a transformer supported by a substrate, in accordance with the present disclosure. Leads 302, 304, e.g., formed from or connected to a lead frame, can be molded with mold material 308, as shown. Integrated circuit (IC) dies 360, 362 (which may also be referred to dies, or semiconductor dies) are shown. Integrated circuit (IC) dies may be attached to mold material 308; in other embodiments, dies 360, 362 may be attached to lead frame material or another structure, e.g., PCB or other supporting platform or substrate. Package 300 includes transformer 365, which may be disposed on and/or connected (directly or indirectly) to supporting substrate 370. Transformer 365 can include first and second coils, each having one or more windings with multiple parts and configured about (extending around) a portion of ferromagnetic core 320.

The attachment of the dies 360, 362 to mold material 308 may use or include suitable material(s) including, but not limited to, an epoxy die attach material, which in some embodiments can be non-conductive die attach material, a dielectric tape, or a wafer back-side coating (WBC) material, or the like. While leads 302, 304 are depicted extending straight from the body of package 300, other lead configurations are also possible for leads 302, 304, including, but not limited to the following: gull-wing (e.g., a standard DIP lead type for SOIC packages), a J-lead (the standard lead for surface mount attachment from the extending out from the package body and bent to allow the lead to be placed flat against a board); a lead that is flush with the package surface or sides; and, a through-hole style lead.

Transformer 365 (including structure/material bounded by dashed line and mold material 308) may be attached (directly or indirectly) to mold material (compound) 308. In some examples, non-conductive epoxy and/or tape may be used to facilitate attaching a die 360, 362 and/or transformer 365 to mold material 308. Transformer 365 can include a ferromagnetic core 320, with two portions 320a, 320b shown in cross-section.

Substrate 370 can include conductive structure that can form the lower winding portions of transformer 365. As shown, substrate 370 can have or include one or more conductive regions or portions, e.g., 371, 374, 376, 379, on the first side and one or more conductive regions or portions, e.g., 373, 378 on the second side. In some embodiments, substrate 370 can include one or more plated through holes or conductive vias, e.g., as shown by vias 372a, 372b, 377a, 377b. In some embodiments, one or more conductive portions on a side (surface) of substrate 370 can be connect to, cover, or form extensions of one or more through holes or vias, e.g., as shown by via end caps 372a', 372b', 377a', and 377b'. As shown, via end caps 372a' and 372b' are adjacent and connected to conductive portion 373, together being part of one lower winding portion with vias 372a-b and conductive portions 371, 374 (lower winding structure indicated by cross-hatching in FIG. 3); via end caps 377a' and 377b' are shown adjacent and connected to conductive portion 378, together being part of another lower winding portion with vias 377a-b and conductive portions 376, 379 (lower winding structure indicated by cross-hatching in FIG. 3). A shown, conductive portions 371, 374, 376, 379, on the first side of the substrate contact vias 372a, 372b, 377a, 377b, respectively.

Package 300 includes conductive structure(s), e.g., wire bonds, that can be configured to extend around a portion of core, forming the upper winding portions of transformer 365. For example, wire bond 332 is shown connecting conductive portion 371 to conductive portion 374, and wire bond 334 is shown connecting conductive portion 376 to conductive portion 379 to form upper winding portions, which are shown extending around (configured about) a portion transformer core 320. Lower winding portions, adjacent transformer core 320, are shown formed by (i) conductive portion 371, via 372a, conductive portion 373, via 372b, and conductive portion 374, and (ii) conductive portion 376, via 377a, conductive portion 378, via 377b, and conductive portion 379. As shown, connection of the upper winding portions with the lower winding portions forms complete windings (with current carrying paths) around a circumference of core 320, e.g., in regions adjacent to the core cross-sections 320a-b.

Wire bond 380 is shown connecting one portion of the transformer 365 to die 360, and wire bond 382 is shown connecting another portion of the transformer 365 to die 362. Wire bond 381 is shown connecting die 360 to lead 302. Wire bond 383 can connect die 362 to lead 304, as shown. While only one wire bond 380, 382 is expressly shown (due to the side view of the drawing) from the transformer 365 to each die 360, 362, one skilled in the art will understand that a second wire bond is also present so that each die 360, 362 has at least two electrical connections to the transformer 365. Likewise, while a single lead (302, 304) and wire bond 381, 381 are shown connected to each die 360, 362, one skilled in the art will understand that at least two leads with corresponding connections (wire bonds) are used to connect each die, respectively, to one or more electrical systems/circuits/components outside of the package 300.

A dielectric material 340, or gel, may be used to cover the transformer 365, and die 360, 362. The dielectric material may include, but is not limited to, DOWSIL™ EG-3810 Dielectric Gel and DOWSIL™ EG-3896 Dielectric Gel. In other examples and embodiments, the lid 350 can be replaced by a second mold material similar to mold material 308 in a second molding process. In some embodiments a cap (a.k.a., housing, lid, or cover) 350 can be attached to mold material 308 and/or leads 302, 304, as shown. Cap 350 can be made/formed by one or more processing techniques/steps, e.g., a single plastic mold step done separately and then glued or attached to the mold compound/material 308.

The transformer substrate 370 may be made from or include suitable material(s), including but not limited to, a flexible circuit material, e.g., polyimide, a printed circuit board (PCB) material such as FR4, a low temperature cofired ceramic (LTCC), alumina, metal only silicon, glass substrate having thin film layers, and/or a high temperature ceramic (HTCC). Conductive portions 371, 373, 374, 376, 378, 379 and vias 372a, 372b, 377a, 377b may be disposed in and/or on transformer substrate 370, e.g., PC board, LTCC board, HTCC board, or alumina thin film construction, etc.

Package 300 can be fabricated so that two conductors/conductive components are spaced apart from other package features/components by a desired distance. For example, lower winding portions 374 and 376 (on opposite sides of the galvanic isolation barrier provided by the transformer 375) can be fabricated to be separated/spaced apart by a desired distance. For further example, depending on any desired isolation voltage requirement(s) for package 300 in a given application, the distance between conductor portions 374 and 376 (or, similarly, between 373 and 378, 374 and 376, or 372b' and 377a') could be 1 mm, 1.2 mm, 1.4 mm, 2 mm, 4 mm, 6 mm, 7.2 mm, 10 mm, or more; of course, these numerical values are illustrative and packages may be fabricated/implements with other distances between components, with the scope of the present disclosure. In some embodiments, package 300 can be fabricated or configured to have a desired separation distance between certain (e.g., conductive) parts/components/features and other parts/components/features, e.g., to meet internal creepage, voltage breakdown, and/or external clearance requirements for a given pollution degree rating as defined by certain safety standards bodies such as the Underwriters Laboratories (UL) and/or the International Electrotechnical Commission (IEC).

Figure 4A:
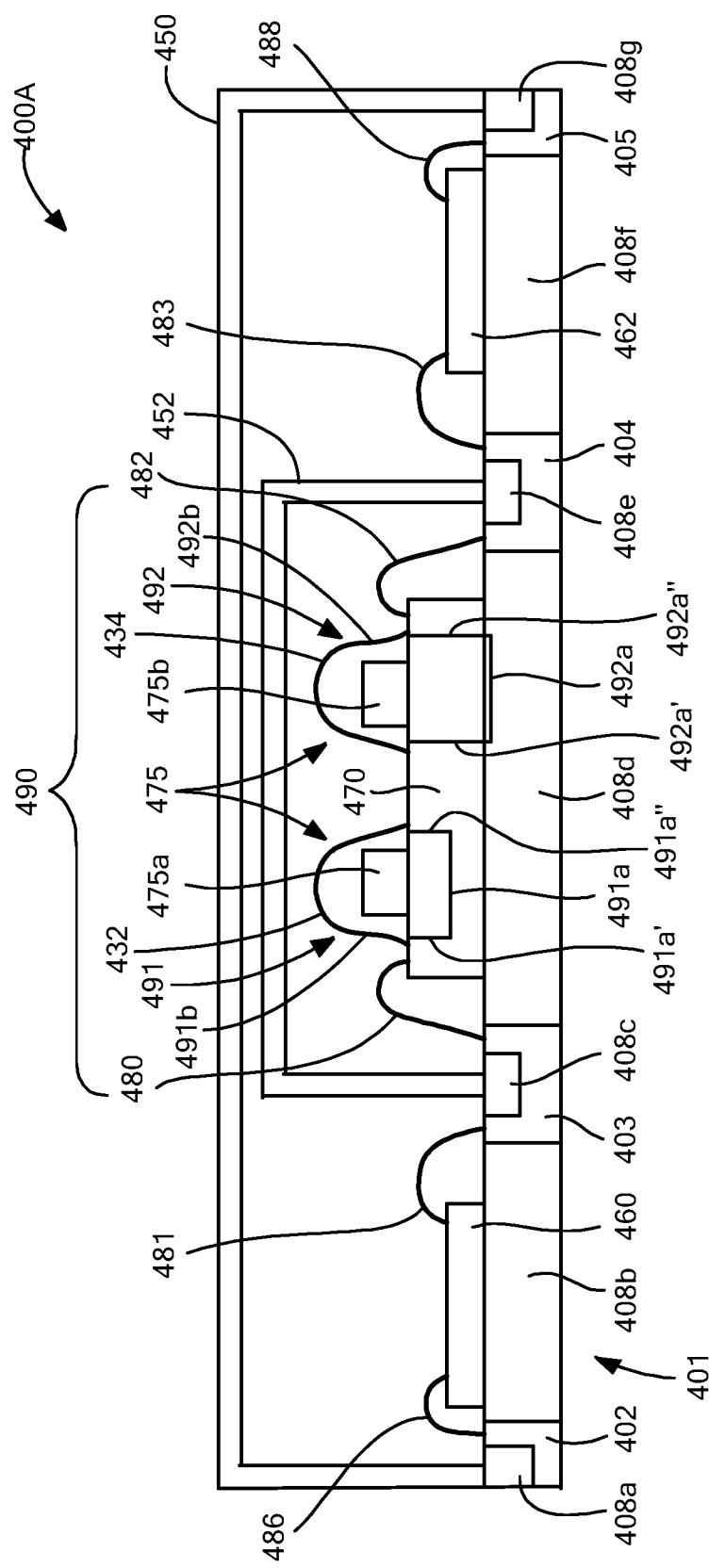
FIG. 4A shows a side view of an example voltage-isolated package with a transformer on a substrate and two integrated circuit (IC) dies with a mold enclosing the integrated circuit dies and transformer, in accordance with the present disclosure.

FIG. 4A shows a side view of an example high voltage package 400A with a transformer 490 on a substrate 470 and two integrated circuit (IC) dies 461, 462 with a mold enclosing (covering) the integrated circuit dies 461, 462 and transformer 490, in accordance with the present disclosure. A molded lead frame 401 is shown having a mold compound 408 and conductive portions 402, 403, 404, 405, which may include leads. In the example shown, mold compound 408 has sections (portions or regions) 408a-g, but in other examples, mold compound 408 may have a different number of sections. Transformer 490 can include a transformer core 475 (shown in cross-section as 475a, 475b) and first and second coils 491, 492

Coils 491, 492 may include multiple components, e.g., first conductive portions 491a, 492a (a.k.a., lower winding portion), respectively, connected to or disposed on the lead frame 401, and second conductive portions 491b, 492b (a.k.a., upper winding portion), respectively, including one or more conductive paths, e.g., wire bonds, straps, or strips, connected (directly or indirectly) to the first conductive portions 491a, 492a and configured around a portion of the transformer core 475. As connected together, the lower winding portions 491a, 492a and upper winding portions 491b, 492b form complete windings of coils 491, 492 (complete or unbroken paths of conductive material that can conduct an electric current) around core 475. As noted, one or more windings may be present for each of the first and second coils 491, 492.

In some embodiments, wire bonds 432, 434 can be used as the upper winding portions (second conductive portions) 491b, 492b over the ferromagnetic core 475 for transformer 490. In some embodiments, the lower winding portions 491a, 492a may themselves have multiple components (pieces or sections). For example, lower winding portion 491a may include plated though holes or vias 491a' and 491a", in substrate 470, and connected by a conductive layer (shown as horizontal layer in substrate 470), as shown. An example of a different lower winding configuration is shown for lower winding portion 492a. As indicated, lower winding portion 492a may include plated though holes or vias 492a' and 492a", in substrate 470, and connected by a conductive layer (shown as layer on lower surface of substrate 470), as shown.

In the example shown, transformer substrate 470 is disposed on (attached to or supported by, directly or indirectly) a non-conductive portion 408d of the molded lead frame 401. A first semiconductor die (a.k.a., first IC die or first die) 460 is disposed on (attached to or supported, directly or indirectly by) nonconductive portion 408b of the molded lead frame 401, and a second semiconductor die (a.k.a., second IC die or second die) 462 is attached to nonconductive portion 408f of the molded lead frame 401. Lead frame molded portions 408a, 408c, 408e, 408g can include or be composed of non-conductive mold material. Conductive portions 402, 403, 404, 405 are shown as partially-etched (e.g., half-etched) lead frame materials. An alternative embodiment may have at least one ferromagnetic core 475 (shown with cross-sections 475a, 475b) can be attached to transformer substrate 480 having lower windings (and vias, in some embodiments), e.g., similar to as shown in FIG. 3.

In some examples, tape or non-conductive epoxy can be used between the core(s) 475 and substrate 470 to add a second layer of insulation/material. In some embodiments, core 475 can include an insulating coating. Substrate 470 may include one or more layers of suitable substrate material (with or without conductive traces/layers), e.g., FR4, glass, alumina, etc. First (transformer) enclosure 452 can cover transformer 475 and can be attached to non-conductive portions 408c, 408e of the molded lead frame 401 with a non-conductive material, e.g., mold material and/or dielectric material. In some embodiments, as shown, a second (die) enclosure 450 may be present to cover integrated circuit dies 460, 462, transformer 490, and cover 452. Second enclosure 450 may be or include a molded body, a pre-molded plastic or epoxy cover, or another suitable material that allows for or facilitates meeting a given voltage isolation requirement. In one embodiment, first enclosure 452 may be a metal lid, a plastic or epoxy molded body. In some examples, the use of a metal lid may increase the size of the package and may facilitate increased (larger) package distances to meet a particular voltage isolation rating/requirement desired for a package.

Figures 4B, 4C:
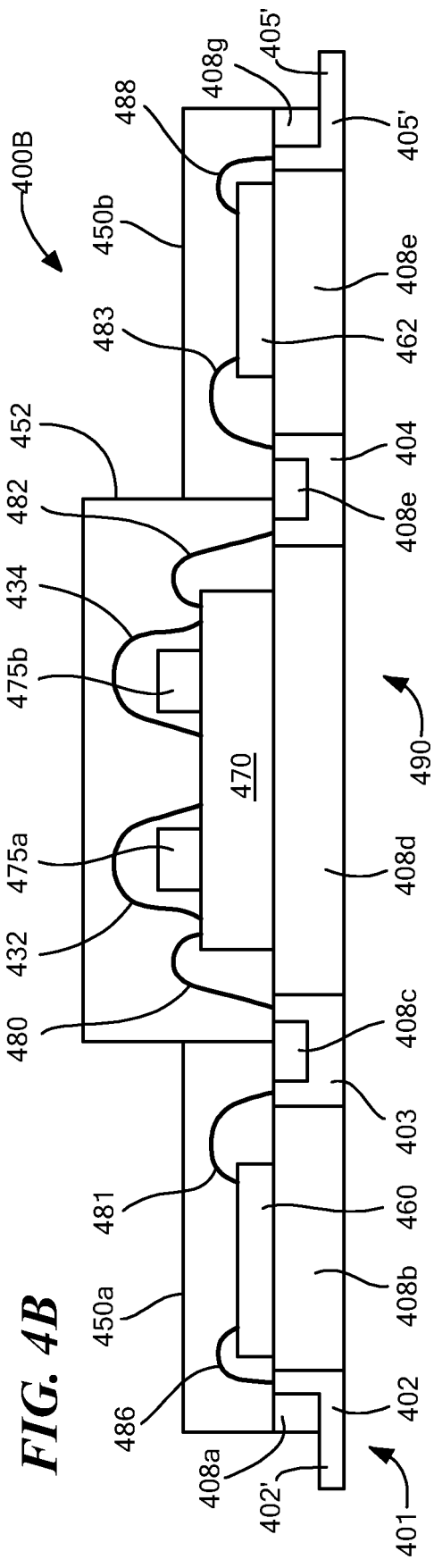
FIGS. 4B and 4C show alternative embodiments of packages similar to the package shown in FIG. 4A.

FIGS. 4B and 4C show alternative embodiments 400B, 400C of packages, respectively, similar to package 400A shown in FIG. 4A. FIG. 4B shows package 400B including a second mold over the die at a lower package height to help reduce mold material costs. FIG. 4C shows package 400C including a transformer that may be made with other techniques, e.g., as shown and described for FIGS. 1A-1B. In some examples, the copper is preferably coplanar with the top half of the leads 403 and 404.

In FIG. 4B, dies (dice) 460, 462 are enclosed/covered by lids (caps), covers, or molded bodies 450a, 450b respectively. The transformer 465 portion of the package is enclosed in/covered by a molded body, lid or cover 452. In one embodiment the die 460, 462 are enclosed in, for example, molded bodies 450a, 450b prior to the transformer 465 and its molded body 452. By having molded bodies 450a, 450b at a different height than molded body 452 less mold material may be used and result in a lower cost package. Although molded body 452 is shown to be of a larger distance from the molded lead frame material 408 when compared to molded bodies (a.k.a., lids or covers) 450a, 450b, other heights of the molded bodies 450a, 450b, 452 are within the scope of the present disclosure. For example, the tops of 450a, 450b, 452 may all be aligned at the same distance (height) from the surface shown for mold compound 408. In some embodiments, the molded bodies or lids 450a, 450b, 452 may be configured or formed as single molded body or lid.

FIG. 4B also shows conductive portions 402, 405 each having a conductive lead (lead portion) 402', 405' extending away from the mold material 408 (as configured to form package body). One reason for this is to allow conductive portions 402', 405' of leads 402, 405 to have a length extending or away from mold compound or mold material (package body) 408 for inspection of solder, or the electrical connection between the package 400B, and a PC board, for example, upon which package 400B is mounted.

FIG. 4C depicts an alternate embodiment 400C to those shown in FIG. 4A and FIG. 4B. In FIG. 4C, a transformer is constructed on top of the molded package portion 408 with leads 402', 403a, 404a, 405'. Conductive portions 403, 404 may have lead portions 403a, 404a and partial-etch (e.g., half-etch) portions 403b, 404b which extend toward the middle of the package to allow construction of a transformer. In some embodiments, partial etch portions 403a, 403b and 404a, 404b may be connected respectively to eliminate the need for a wire bond 480 connecting 403a, 403b, and a wire bond 482 connecting 404a, 404b. Insulation layers 412, 414 can be placed on top of the extended conductor portions 403, 404. Insulation layers 412, 414 may be a tape material, a non-conductive epoxy mold compound, or other insulating material. A second mold 450 (450a and 450b) is shown over the dies 460, 462, and transformer 490; second mold 450 (450a and 450b) can be applied as a single mold step. Mold 450 (450a and 450b) may alternatively be applied by multiple mold steps to cover the die 460, 462, and transformer 490 as shown in FIGS. 4A-4B.

In some examples, e.g., in which molded package portion 408 is subject to a partial etch process, mold material portions 408a, 408b, 408c, 408e, 408f, and 408g may be at a different height than 408d. In some examples and embodiments, mold material portions 408c, 408e may have a step or slope shape to allow the top edge of 408d to be higher than the top edge of surface 408b, 408f. Surfaces 408a, 408g may be at a height of 408b, 408e, or 408a, 408g or at some third height level. A ferromagnetic material for core 475 (shown as cross sections 475a, 475b for a closed loop, e.g., toroid) can then be placed on the insulation layers 412, 414. In some embodiments, a soft ferromagnetic material can be used for core 475. The shape of the ferromagnetic material may be in the form of a closed loop shape (e.g., toroid, ring, rectangle, square, etc.) extending into and out of the plane of the drawings to form a closed loop in a top view. Another embodiment of the soft ferromagnetic core material is in the shape of a rectangle from the top view. In one embodiment the soft ferromagnetic material to for the core can be a single piece of material.

In FIG. 4C wire bond 432, forming an upper winding portion, is shown connected to lower winding (conductor) portion 403b, while in FIG. 4B, wire bond 432 is connected to another lower winding (conductor) portion (not shown) in or on substrate 470 in FIG. 4B. Similarly, in FIG. 4C wire bond 434, forming an upper winding portion, is shown connected to lower winding (conductor) portion 404b, while in FIG. 4B, wire bond 434 is connected to another lower winding (conductor) portion (not shown) in or on substrate 470 in FIG. 4B. Transformer 470 may be formed with a lead frame process as shown and described in relation to FIGS. 1A-1B and/or FIGS. 2A-2D, with or without a substrate as shown and described in relation to FIG. 3; transformer 470 may be realized/fabricated by other suitable methods including typical transformer fabrication techniques.

In some embodiments/examples, depending on one or more given isolation voltage requirement(s), such as to meet a target creepage value, the distance between conductor portions 403a and 404a, shown as $d_1$, may be, e.g., 1 mm, 1.2 mm, 1.4 mm, 2 mm, 4 mm, 6 mm, 7.2 mm, 10 mm, or larger than 10 mm. In other embodiments, the minimum distance between any two transformer wire bonds 432, 434, and the minimum distance between lower transformer portions 403b, 404b, shown as $d_2$, can be, e.g., at least 1 mm, 1.2 mm, 1.4 mm, 2 mm, 4 mm, 6 mm, 7.2 mm, 10 mm, or larger than 10 mm.

FIGS. 5A-G show views of different fabrication stages of an example voltage-isolated IC packages 500 having transformers implemented with lead frames, in accordance with the present disclosure.

Figure 5A:
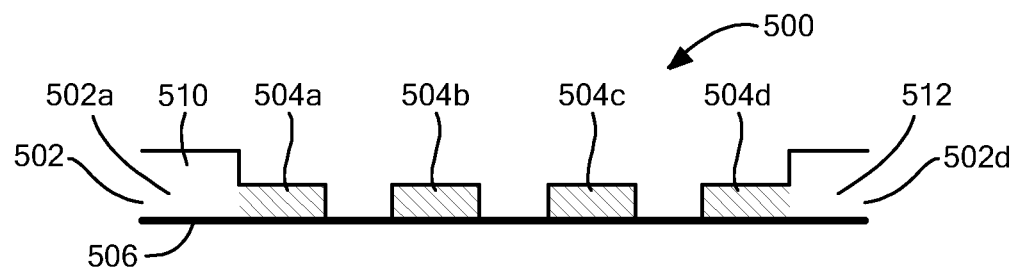
FIGS. 5A-G show views of different fabrication stages of example voltage-isolated IC packages having transformers implemented with lead frames, in accordance with the present disclosure.
Figure 5B:
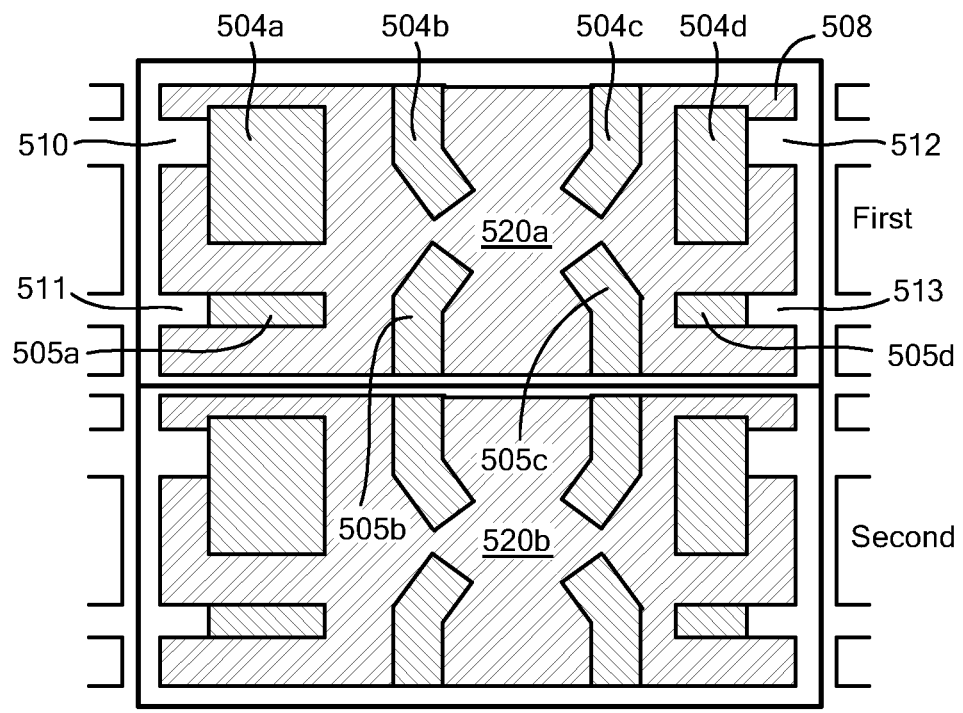

FIG. 5A shows a side view of a lead frame structure 500 with a copper lead frame 502 on a tape or film material 506. The lead frame 502 and tape 506 can be used in a film-assisted molding process. Leads 510, 512 are shown with full thickness of the lead frame 502. Thinned portions 504a, 504d are formed, e.g., partially etched, and providing die attach areas (die pads or paddles) 504a, 504d. In some embodiments, the fabrication of the partially etched lead frame (areas of the lead frame having different thicknesses) may include so-called half-etched processes. In other embodiments, e.g., ones with larger physical dimensions, stamping processes (e.g., stamp and coin) may be used for fabrication of the lead frame. Partially etched regions 504b, 504c can be used as lower winding portions for a transformer (as included in the finished package). A mold step can be used to fill the regions of the lead frame, between the tape and the other portion of the lead frame 502, with a mold material as shown in FIG. 5B. The mold material can provide insulation between the partially, or half-etched elements 502a, 502b, 502c, 502d. The presence of the mold material can also serve to increase the exposed lead portion of the final package to a distance to at least that between the unetched portions connected to 502a, 502d, which, in some embodiments may facilitate meeting an external clearance dimension (distance) for a given pollution degree rating as defined by certain safety standards bodies such as the Underwriters Laboratories (UL) and/or the International Electrotechnical Commission (IEC).

FIG. 5B shows a top view of two package positions and related structure in a lead frame where die paddles 504a, 504d are shown connected to leads 510, 512 respectively. Leads 511, 513 are shown connected to partially etched portions 505a, 505d respectively. Lower transformer winding portions 504b, 504c, 505b, 505c are shown. In some embodiments, additional lower winding portions can be placed between 502b, 502c. The length of the package (where length is left to right in FIG. 5A and FIG. 5B) can be made larger to accommodate a greater number of lower transformer portions. Leads 510, 511 are shown on the left side of the lead frame, and leads 512, 513 are shown on the right of the lead frame. Additional leads may be provided, and the width of the lead frame portion may be extended, where the width is defined as top to bottom in FIG. 5B. A second lead frame package position is shown in FIG. 5B below the first, illustrating one possible example of how multiple package positions may be made in a lead frame; others may of course be practiced within the scope of the present disclosure.

Figure 5C:
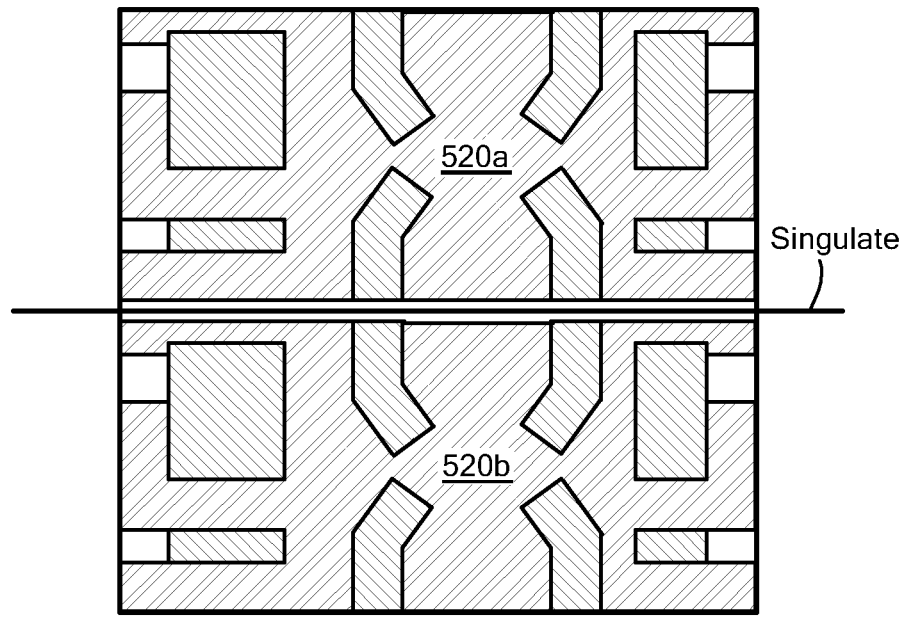

FIG. 5C shows a top view after molding of the lead frame structure in FIGS. 5A and 5B with package positions 520a-b shown removed from surrounding structure. A representative singulation line is shown between package positions 520a-b.

Figure 5D:
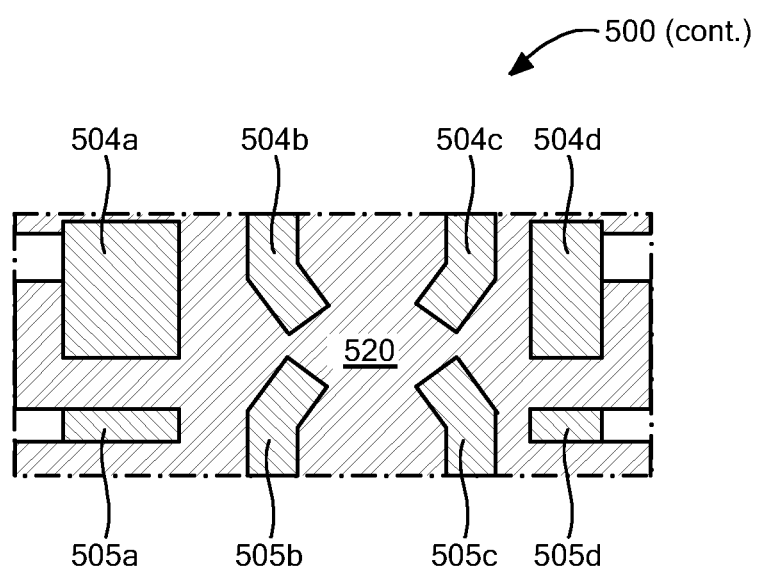

FIG. 5D shows a top view of the package 500 after singulation. Lead portions 504a, 504d, and transformer lower winding portions 504b, 504c are exposed in this view.

Figure 5E:
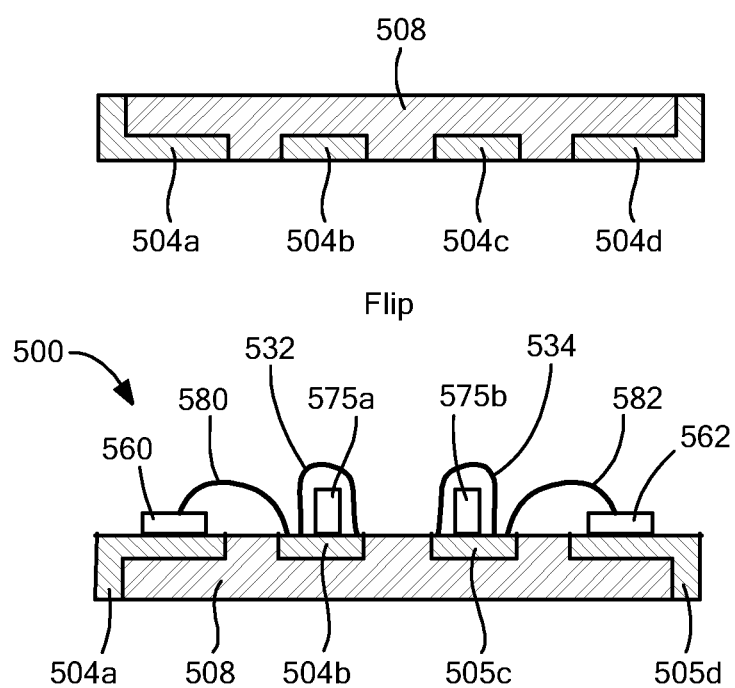

FIG. 5E shows a side view of the package 500 with die 560 placed on die paddle 504a and die 562 is mounted on die paddle 504d. A soft ferromagnetic core 575 is shown with two pieces 575a, 575b, which may be made of but is not limited to ferrite, is shown attached above lower winding portions 504b, 504c respectively. Wire bond 532 is shown connecting lower windings (only one lower winding 504b is shown) over core portion 575a, and wire bond 534 connects lower windings (only one winding 504c is shown) over core portion 575b. The core 575a, 575b may be attached to the lower winding portions 504b, 504c including but not limited to using a non-conductive epoxy, a double sided tape, or a combination of tape and epoxy or other adhesive(s). Wire bond 532 connects lower winding portions 504b to die 560 and wire bond 534 connects lower winding portions 504c to die 562.

Figure 5F:
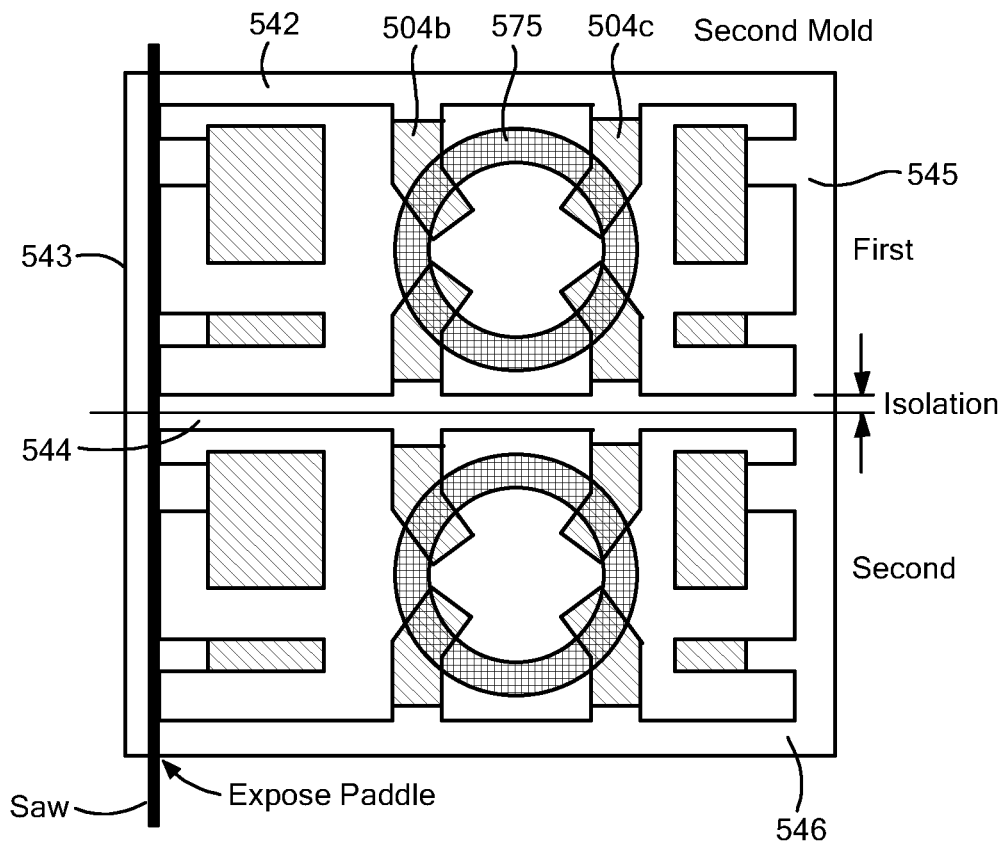

FIG. 5F is a top-view of package 500 showing a second mold with side mold portions 542, 543, 544, 545, 546 around two package positions (circled as 1 and 2). The second mold covers the top of the core 575 and dice (dies) 560, 562. In some examples/embodiment, the second mold covers the sides of the transformer lower windings 504b, 504c to increase the creepage distance between exposed copper or lead material portions. The final package can be realized by using a saw, or laser, or other cutting or separation techniques/apparatus to separate or cut the second mold material along sides 542, 543, 544, 545, and 546.

Figure 5G:
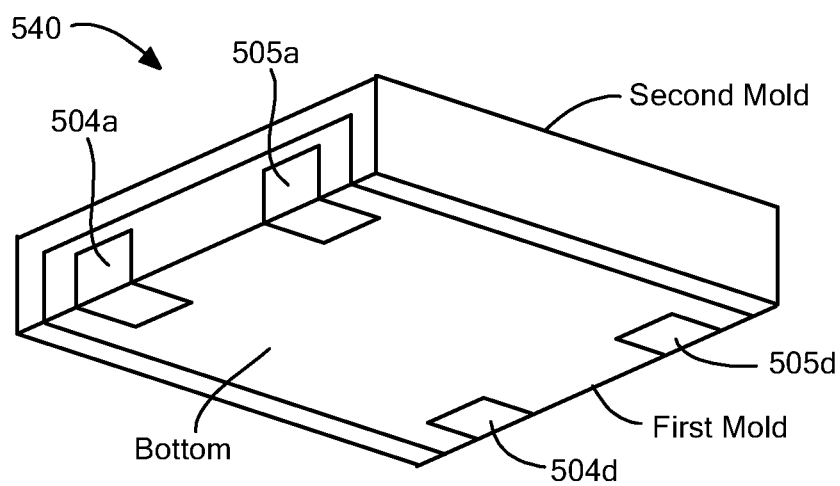

FIG. 5G shows a schematic view of the final package 500 after singulation. Four leads 504a, 504d, 505a, 505d are shown; other numbers of leads are of course possible within the scope of the present disclosure. For the view shown, exposed lead frame portions 504,b, 504c, 505b, 505c (not shown) are covered by the second mold material.

Figure 6:
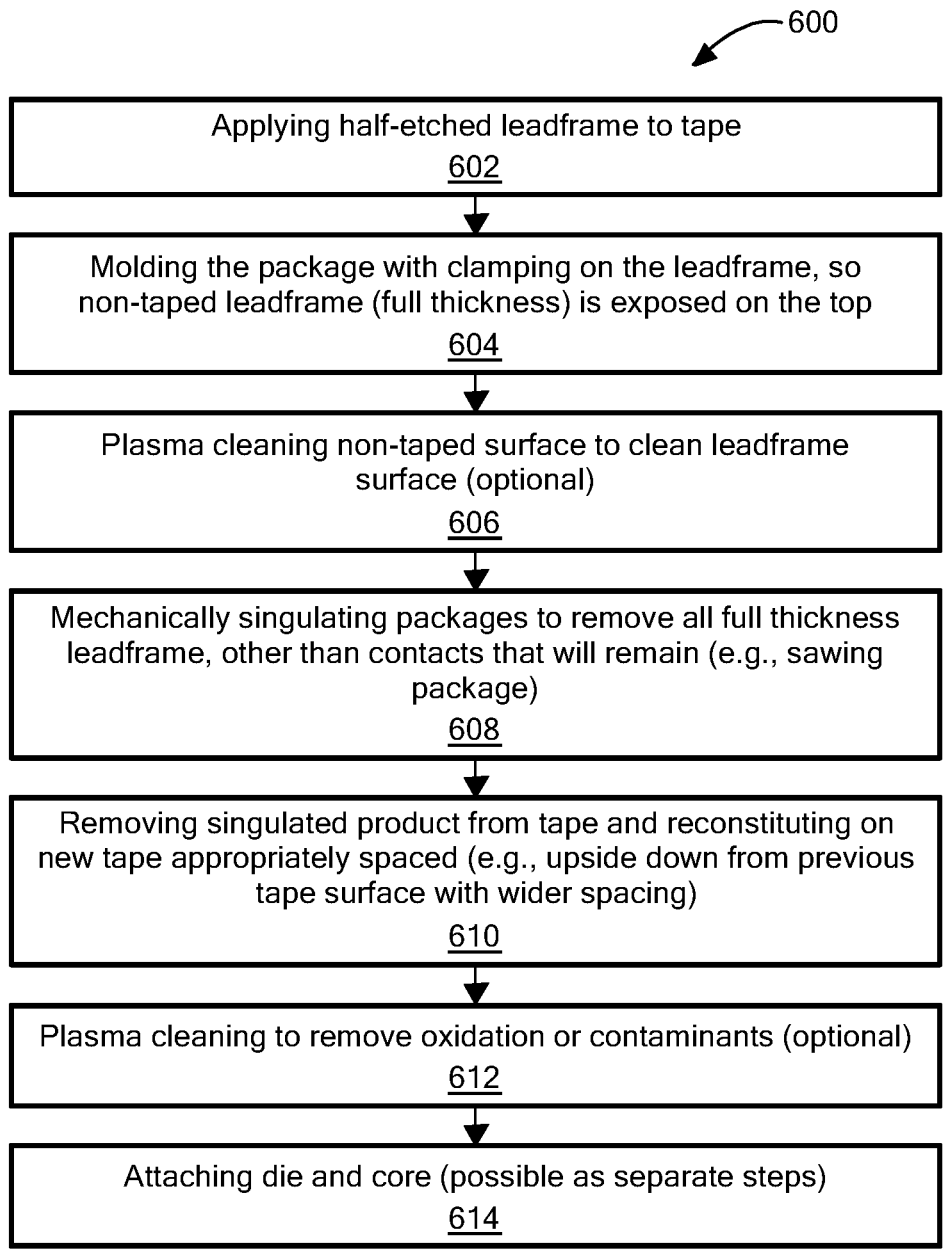
FIG. 6 shows a block diagram of steps in an example method of fabricating voltage-isolated IC packages having a transformer implemented with lead frames, in accordance with the present disclosure.
Figure 6:
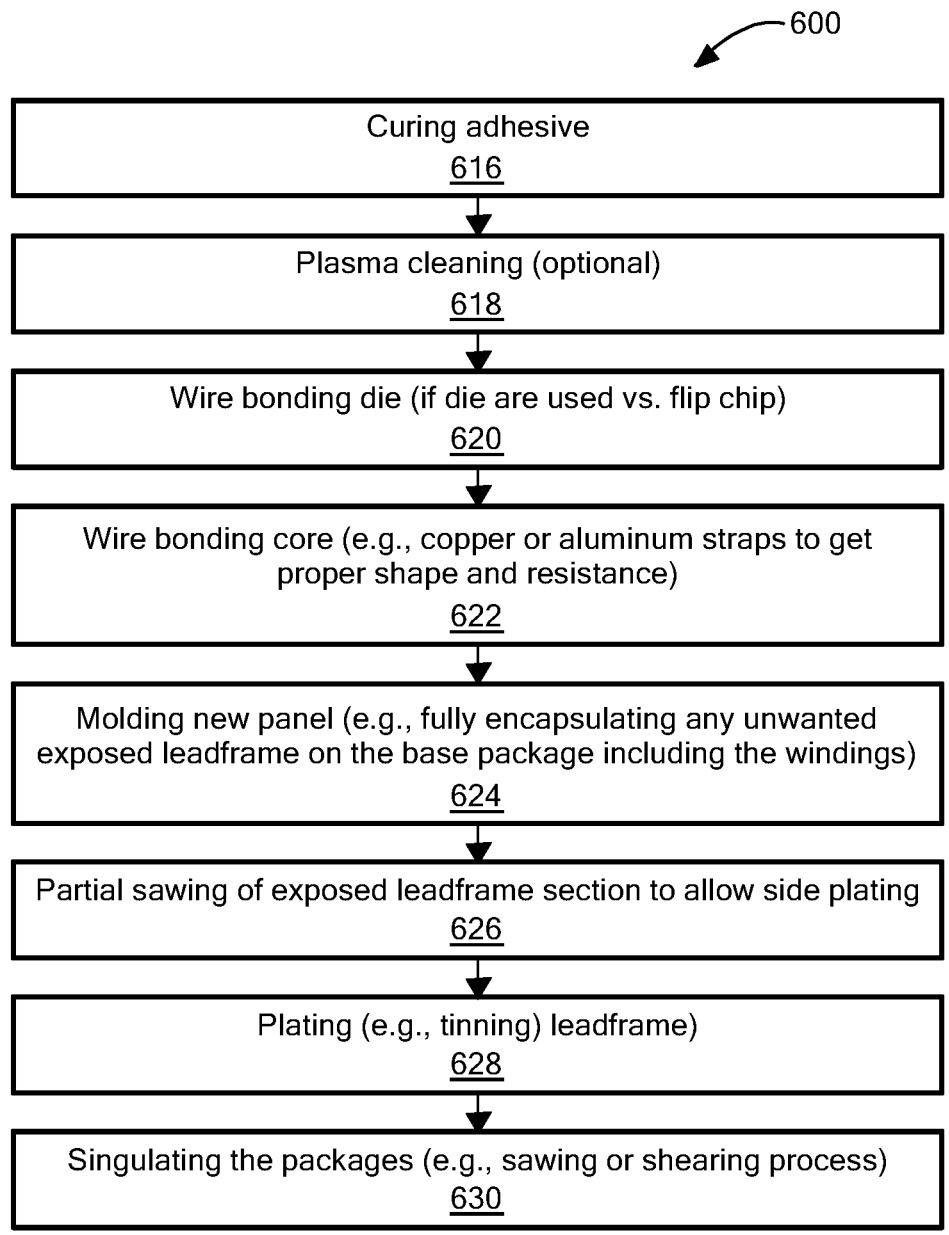

FIG. 6 shows a block diagram of steps in an example process/method 600 of fabricating voltage-isolated IC packages having transformer implemented with lead frames, in accordance with the present disclosure. While certain steps of fabrication process 600 are shown/described in a given order, such given order is merely for illustrative purposes; it will be understood that fabrication process 600 can be performed with the noted or different or similar steps in one or more different orders. Example process 600 can include attaching a partially etched lead frame material to a tape or film on one side, as described at 602. This is inverted from typical quad flat no-lead (QFN) mold process. The package can be molded with clamping on the lead frame, so non-taped lead frame (full thickness) is exposed on the top, as described at 604. Non-taped surfaces can be plasma cleaned to clean lead frame surface (optional), as described at 606.

Packages can be physically singulated (separated) to remove all full thickness lead frame other than full thickness contacts that will remain in a package (e.g., contacts 510, 511, 512, and 513 shown in FIG. 5B), as described at 608. The singulation may be realized by using a saw, or laser, or other cutting or separation techniques. The singulated packages (product) can be removed from the tape and reconstituted (placed) on new tape appropriately spaced, and upside down from previous tape surface, as described at 610. The packages can have a wider on the second tape than spaced before on the first tape. The packages can optionally be plasma cleaned to remove oxidation or contaminants, as described at 612. The die(s) and core can be attached (in one process step if using same attach material, but possible as separate steps), as described at 614. In some embodiments, the die(s) and core can be mounted by a flip-chip process, which may include a separate reflow process.

Continuing with the description of process 600, adhesive can be cured, as described at 616. The packages can be plasma cleaned (optional), as described at 618. The die(s) can be wire bonded die, as described at 620. The core can be wire bonded, e.g., using copper or aluminum straps to obtain a desired shape and/or resistance, as described at 622. A new panel can be molded, e.g., fully encapsulating any exposed lead frame on the base package, including the windings, as described at 624. The lead frame can be sawn (e.g., using half saw techniques) to expose the lead frame section to allow side plating, as described at 626. The lead frame can be plated, e.g., using tinning techniques, as described at 628. Final singulation of the packages can be performed, as described at 630. The singulation 630 may be realized by using a saw, or laser, or other cutting, shearing, or separation techniques to separate or cut the second mold (e.g., dielectric) material along sides of the final package.

Accordingly, embodiments of the inventive subject matter can afford various benefits relative to prior art techniques. Embodiments and examples of the present disclosure can enable or facilitate lower costs and higher scalability for manufacturing of IC packages/modules having voltage-isolated IC dies and transformers.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while some examples are described herein as having a single core and/or transformer, other examples and embodiments may include multiples cores and/or transformers. For further example, while embodiments and examples are described herein as generally including two transformer windings (coils), examples and embodiments of the present disclosure may include a different number of transformer windings, including, but not limited to: one, three, four, five, etc.; moreover, the windings (coils) themselves may each have a whole number or fractional number of turns (loops about a related core or structure), e.g., 1.5, 2.5, 1.75, 1.8, 2.25, etc. Additionally, while certain dimensions have been described above by way of example, other dimensions may of course be practiced (used) within the scope of the present disclosure.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target (or nominal) value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A voltage-isolated integrated circuit package comprising:
    a lead frame having first and second conductive portions each configured to receive an integrated circuit die;
    a first integrated circuit die disposed on the lead frame on a first conductive portion;
    a second integrated circuit die disposed on the lead frame on a second conductive portion;
    a transformer having first and second coils and configured to provide magnetic coupling and galvanic separation between the first and second integrated circuit dies;
    a dielectric material enclosing a portion of the transformer;
    a mold material configured to cover a portion of the lead frame; and
    a cap configured to cover the transformer, the mold material, and the dielectric material.

2. The voltage-isolated integrated circuit package of claim 1, wherein the lead frame comprises a partially-etched portion, wherein the cap is positioned over the partially-etched portion of the lead frame.

3. The voltage-isolated integrated circuit package of claim 2, wherein the mold material comprise a first mold material secured to the lead frame; and a second mold material enclosing the first integrated circuit die and the second integrated circuit die.

4. The voltage-isolated integrated circuit package of claim 2, wherein the lead frame comprises a plurality of voltage leads extending from a side of the package.

5. The voltage-isolated integrated circuit package of claim 1, wherein the transformer comprises a dielectric structure, a ferrite core, and one or more wire bonds.

6. The voltage-isolated integrated circuit package of claim 5, wherein the dielectric structure is comprised of a flexible circuit, a printed circuit board (PCB), a low temperature cofired ceramic (LTCC), an alumina substrate comprising thin film layers, a glass substrate comprising thin film layers, metal only silicon, or a high temperature cofired ceramic (HTCC).

7. The voltage-isolated integrated circuit package of claim 1, wherein the cap comprises of plastic.

8. The voltage-isolated integrated circuit package of claim 1, wherein the dielectric material comprises a soft gel.

9. The voltage-isolated integrated circuit package of claim 1, wherein a shortest distance between the first and second conductive portions of the lead frame is at least 1 mm.

10. The voltage-isolated integrated circuit package of claim 1, wherein a shortest distance between the first and second conductive portions of the lead frame is at least 1.2 mm.

11. The voltage-isolated integrated circuit package of claim 1, wherein a shortest distance between the first and second conductive portions of the lead frame is at least 1.5 mm.

12. The voltage-isolated integrated circuit package of claim 1, wherein a shortest distance between the first and second conductive portions of the lead frame is at least 3 mm.

13. The voltage-isolated integrated circuit package of claim 1, wherein a shortest distance between the first and second conductive portions of the lead frame is at least 5.5 mm.

14. The voltage-isolated integrated circuit package of claim 1, wherein a shortest distance between the first and second conductive portions of the lead frame is at least 7.2 mm.

15. The voltage-isolated integrated circuit package of claim 1, wherein a shortest distance between the first and second conductive portions of the lead frame is at least 8 mm.

16. The voltage-isolated integrated circuit package of claim 1, wherein the first or second integrated circuit dies comprise a gate driver configured to drive a solid state switch.

* * * * *